(12) United States Patent
Forbes (10) Patent No.: US 7,369,623 B2
(45) Date of Patent: May 6, 2008

(54) APPARATUSES TO SIMULTANEOUSLY DISTRIBUTE CLOCK SIGNALS AND DATA ON INTEGRATED CIRCUITS, INTERPOSERS, AND CIRCUIT BOARDS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/594,480

(22) Filed: Nov. 8, 2006

(65) Prior Publication Data

US 2007/0053467 A1  Mar. 8, 2007

Related U.S. Application Data

(63) Continuation of application No. 11/243,825, filed on Oct. 5, 2005, now Pat. No. 7,190,736, which is a continuation of application No. 09/943,968, filed on Aug. 30, 2001, now Pat. No. 6,956,908.

(51) Int. Cl.
*H04L 27/10* (2006.01)
(52) U.S. Cl. ............ 375/283; 375/305; 375/330; 375/354; 327/141; 713/400; 713/503; 714/700; 714/731
(58) Field of Classification Search .......... 375/279, 375/283, 308, 324, 329, 330, 340, 354; 327/141, 327/150, 154, 159; 329/304, 305; 713/400, 713/500, 503, 600; 714/700, 731
See application file for complete search history.

(56) References Cited

U.S. PATENT DOCUMENTS 4,363,002 A   12/1982  Fuller
4,760,344 A   7/1988   Takase et al.
5,399,987 A   3/1995   Yamamoto et al.
6,424,682 B1  7/2002   Enguent et al.
6,535,071 B2  3/2003   Forbes

OTHER PUBLICATIONS

K. Yip, "Clock tree distribution: balance is essential for a deep-submicron ASIC design to flourish," IEEE Potentials, vol. 16, No. 2, pp. 11-14, Apr.-May 1997.
K. M. Carrig et al., "A Clock methodology for high-performance microprocessors," Proc. Custom Integrated Circuits Conference, Santa Clara, CA, May 5-8, pp. 119-122, 1997.
J.L. Neves et al., "Automated synthesis of skew-based clock distribution networks," VLSI Design, vol. 7, No. 1, pp. 31-57, 1998.
T. Meincke et al. ,"Globally asynchronous locally synchronous architecture for large high-performance ASICs," IEEE Symp. on Circuits and Systems, Orlando, FL, May 30-Jun. 2, vol. 2, pp. 512-515, 1999.

*Primary Examiner*—Dac V. Ha
(74) *Attorney, Agent, or Firm*—TraskBritt (57) ABSTRACT

A technique is described for simultaneously and synchronously transmitting digital data and a clock signal in a digital integrated circuit, circuit board, or system. The technique is based on the phase shift keying (PSK) modulation of an RF high frequency carrier which is distributed on low impedance interconnection transmission lines. The PSK modulation contains the digital data while the carrier itself constitutes the clock signal, and the clock signal and digital data are transmitted in a synchronous manner. The carrier frequency may be near $f_T$, the maximum operation frequency of the transistors. Since the digital data and clock signal are simultaneously transmitted on the same interconnection, the digital data never becomes skewed with respect to the clock signal, or vice versa.

16 Claims, 6 Drawing Sheets

"H" - TREE

Fig. 1A
(PRIOR ART)

GRID

Fig. 1B
(PRIOR ART)

BALANCED TREE

Fig. 1C
(PRIOR ART)

BALANCED TREE WITH BUFFERS

APPARATUSES TO SIMULTANEOUSLY DISTRIBUTE CLOCK SIGNALS AND DATA ON INTEGRATED CIRCUITS, INTERPOSERS, AND CIRCUIT BOARDS

CROSS-REFERENCE TO RELATED APPLICATIONS

This application is a continuation of application Ser. No. 11/243,825, filed Oct. 5, 2005, now U.S. Pat No. 7,190,736, issued Mar. 13, 2007, which is a continuation of application Ser. No. 09/943,968, filed Aug. 30, 2001, which is now U.S. Pat. No. 6,956,908, issued Oct. 18, 2005.

BACKGROUND OF THE INVENTION

1. Field of the Invention

The present invention relates to the timing of clock and data signals in integrated circuits. More specifically, the invention relates to simultaneous transmission of digital data and clock signals to eliminate skewing of the data and clock signals with respect to each other.

2. State of the Art

Digital integrated circuits typically include multiple logic elements, with the timing of operation of each logic element controlled by a clock signal. It is common for an integrated circuit chip to have one central clock generator, with the signal from the clock generator being distributed around the integrated circuit via clock-line interconnects. An important consideration in the design of digital integrated circuits is the timing of the arrival of clock and data signals at various logic elements.

Variation in clock signal arrival time is referred to as clock skew. A variety of techniques have been used to provide clock connections that are symmetrical and all of the same length in order to minimize clock skew at the various logic elements, including, for example, the methods of Yip and Carrig. See, K. Yip, "Clock tree distribution: balance is essential for a deep-submicron ASIC design to flourish," IEEE Potentials, vol. 16, no. 2, pp. 11-14, April-May, 1997; and K. M. Carrig et al., "Clock methodology for high-performance microprocessors," Proc. Custom Integrated Circuits Conference, Santa Clara, Calif., pp. 119-122, May 5-8, 1997. A number of prior art approaches are illustrated in FIGS. 1A-1D.

Figure 1A:
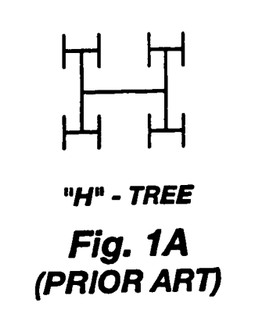
FIG. 1A shows a prior art H-tree clock-distribution structure.

FIG. 1A illustrates an H-tree clock-distribution, which is used primarily in custom layouts and has varying tree interconnect segment widths to balance skew throughout the chip.

Figure 1B:
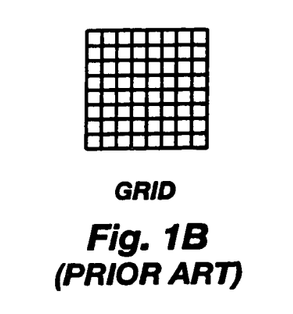
FIG. 1B shows a prior art clock grid clock-distribution structure.

FIG. 1B shows a clock grid clock-distribution structure. The clock grid is the simplest clock-distribution structure and has the advantage of being easy to design for low skew. However, it is area inefficient and power hungry because of the large amount of clock interconnect required. Nevertheless, some chip vendors are using this clock structure for microprocessors.

Figure 1C:
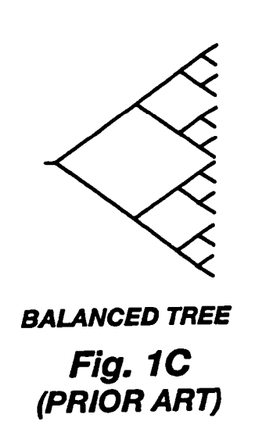
FIG. 1C shows a prior art balanced tree clock-distribution structure.

FIG. 1C depicts a balanced tree clock-distribution structure. The balanced tree is the clock-distribution structure most commonly used in high performance chips. See, J. L. Neves et al., "Automated synthesis of skew-based clock-distribution networks," VLSI Design, vol. 7, no. 1, pp. 31-57, 1998. In order to carry current to the branching segments, the clock line is widest at the root of the tree and becomes progressively narrower at each branch. As a result, the clock line capacitance increases exponentially with distance from the leaf cell (clocked element) in the direction of the root of the tree (clock input). Moreover, additional chip area is required to accommodate the extra clock line width in the regions closer to the root of the tree.

Figure 1D:
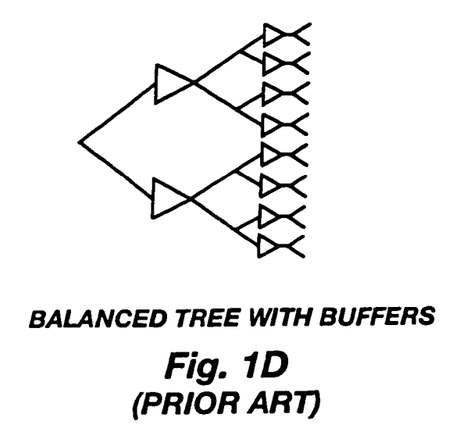
FIG. 1D shows a prior art balanced tree clock-distribution structure that includes buffers at branching points for reduction of clock-interconnect capacitance.

As shown in FIG. 1D, buffers may be added at the branching points of the balanced tree structure. Adding buffers at the branching points of the tree significantly lowers clock interconnect capacitance, because it reduces the clock line width required toward the root.

Figure 2:
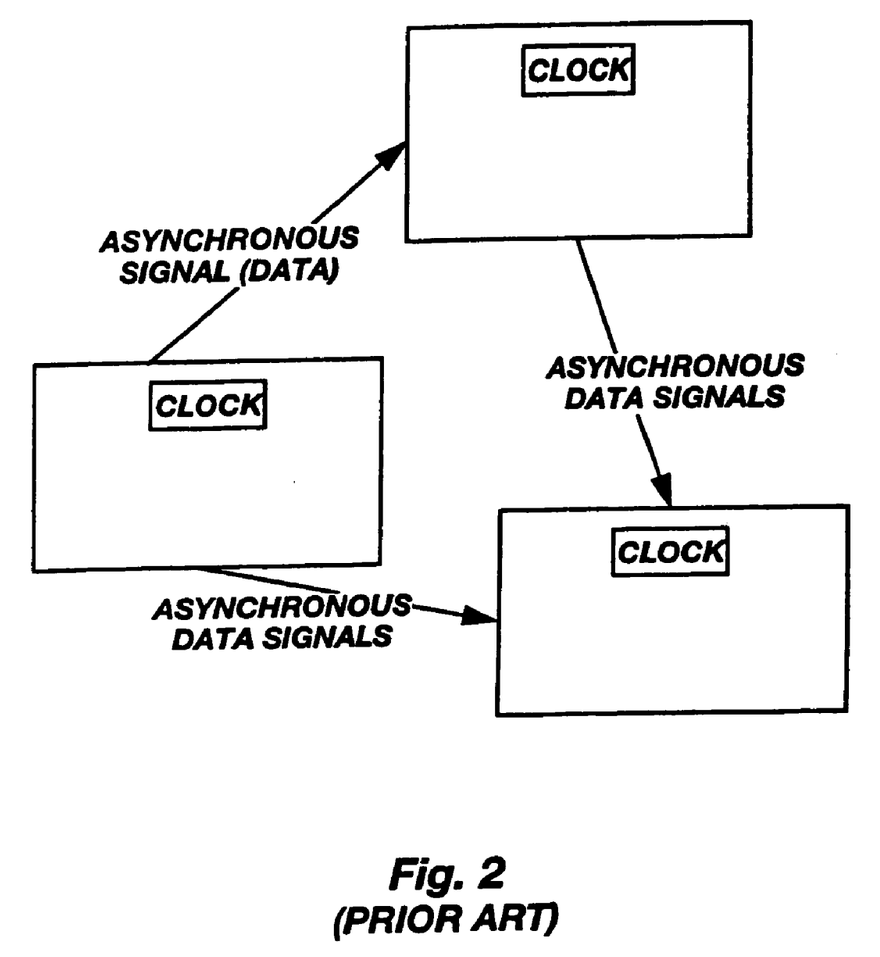
FIG. 2 illustrates a prior art method of partitioning a system into multiple blocks.

One prior art alternative to generating clock signals centrally and distributing them about the chip is to partition the chip design into blocks, as shown in FIG. 2. A synchronous clock signal is used only within a single block, while communication between different blocks is performed on an asynchronous basis. See, T. Meincke et al., "Globally asynchronous locally synchronous architecture for large high-performance ASICs," IEEE Symposium On Circuits and Systems, Orlando, Fla., Vol. 2, pp. 512-515, 30 May-2 Jun., 1999.

In the past, clock design has not typically been considered within the context of full chip timing. Existing design methodologies typically treat clock skew as a problem to be eliminated, and most designers strive to achieve zero skew. However, producing clock signals with zero skew may not be the optimum way to achieve either the safest or the highest performance clock design. It is often the case that, even after zero skew is attained, chip failures are caused by simultaneous switching current or other timing related problems.

There remains a need for a method of coordinating the timing of clock and data signals on a chip that can be achieved with a simple design and a minimum number of critical paths on the chip. It would be desirable to reduce the power consumption associated with clock-distribution lines or other chip timing circuitry. It would also be desirable to reduce the sensitivity of chip timing to process variations and various intermittent noises. Finally, there is an ongoing need for the development of higher speed methods for clocking data to provide enhanced chip performance.

BRIEF SUMMARY OF THE INVENTION

The methodology of the present invention addresses the problem of meeting a chip's timing requirements by combining clock timing with data path timing. Clock skew is treated not as a problem but as a controllable design variable which may be used to optimize overall chip timing. The invention achieves simultaneous distribution of clock and data signals by performing phase shift keying of digital data signals on clock frequency AC carrier signals, transmitting the keyed signals to different locations on the chip, and demodulating the keyed signals to retrieve digital data and clock signals. The inventive method may be used for signal interconnections on integrated circuits, interposers, and circuit boards.

The present invention reduces the number of critical paths on the chip in order to simplify designs and achieve timing closure. The present invention also allows increased clock frequency, thereby improving chip performance. Further, the present invention increases tolerance of chip timing to process variations and intermittent noise. The present invention may be used to create a larger timing budget to reduce power consumption. The present invention may also be used to reduce peak current and simultaneous switching noise to eliminate interference between digital and analog circuits.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

In the present invention, analog signal techniques are used for signal interconnections on integrated circuits, interposers, and circuit boards. The clock signal is used as a high frequency carrier for signal interconnection and is modulated by the digital data using phase shift keying (PSK). PSK refers to a modulation technique that alters the phase of the carrier. Binary phase shift keying (BPSK), which is used in the present invention, has two phases, represented by the binary values 0 and 1. PSK is a special type of amplitude modulation, or a type of amplitude shift keying (ASK) which creates signals having values −1 or 1, and its bandwidth is the same as that of ASK. The inventive method includes the use of binary phase shift keying and low frequency differential modulation of the phase of a high frequency carrier. This approach results in a narrow bandwidth of the modulated signal comparable to that obtained with simple amplitude shift keying.

Figure 3:
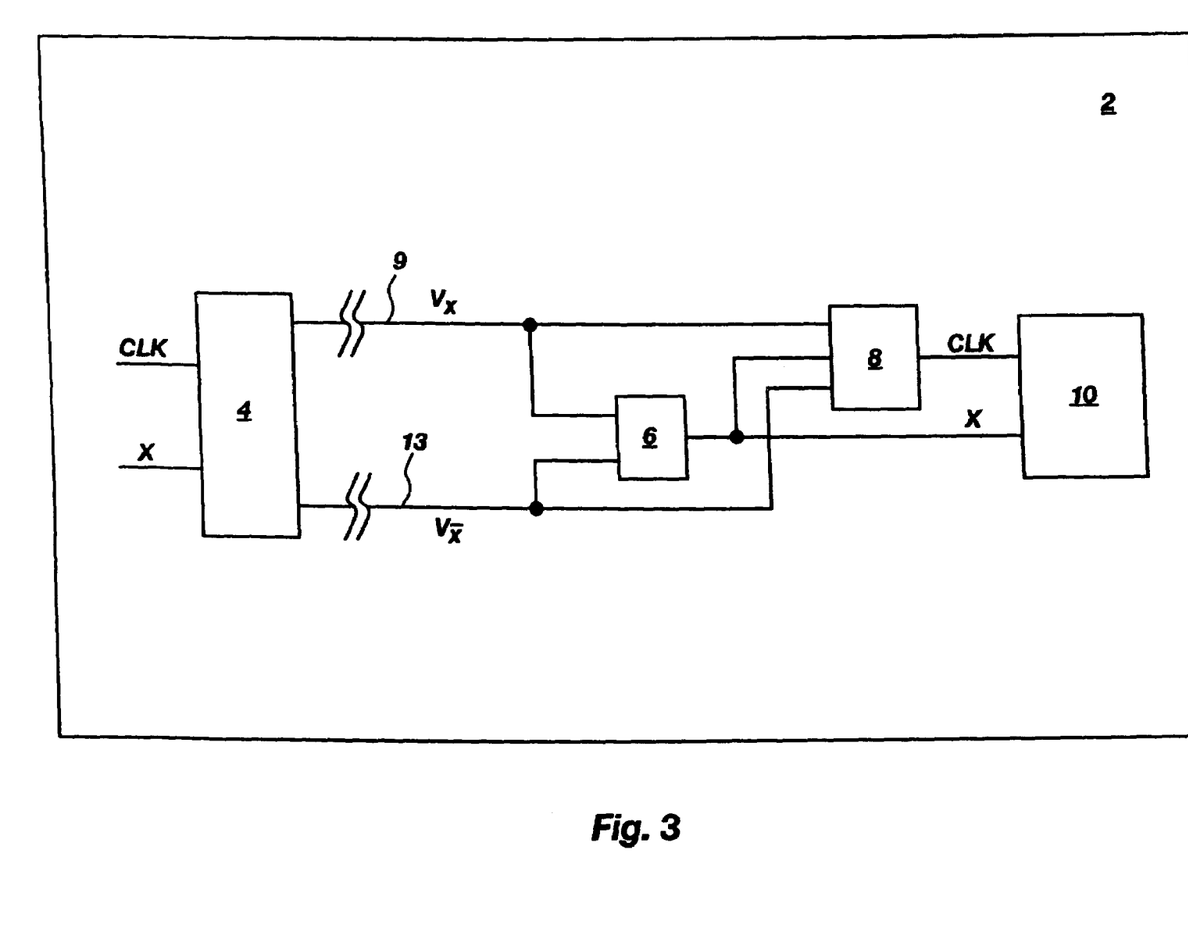
FIG. 3 is a block diagram of a device including circuitry for phase shift keying and demodulation of clock and digital data signals according to the present invention.

FIG. 3 is a block diagram of a device 2 including circuitry for performing phase shift keying of clock and digital data signals and subsequent demodulation of the PSK signals to retrieve the clock and digital data signals. Device 2 may be an integrated circuit, interposer, circuit board, or similar device. Device 2 includes phase shift keying circuitry 4, which performs phase shift keying of the digital data signal X onto the clock signal CLK to generated phase shift keyed signals $V_x$ and $V_{\bar{x}}$. Phase shift keying circuitry 4 is located near the clock source on device 2. PSK signals $V_x$ and $V_{\bar{x}}$ are transmitted on interconnection lines 9 and 13 to digital signal demodulator 6. Digital signal demodulator 6 demodulates PSK signals $V_x$ and $V_{\bar{x}}$ to retrieve digital data signal X. Digital data signal X and PSK signals $V_x$ and $V_{\bar{x}}$ are input to clock signal demodulator 8, which demodulates PSK signals $V_x$ and $V_{\bar{x}}$ to retrieve the clock signal. The clock signal and digital data signal X are input to clocked element 10 with no relative time delay between the two. Digital signal demodulator 6 and clock signal demodulator 8 are located close to clocked element 10 but may be located at some distance from phase shift keying circuitry 4.

Figure 4:
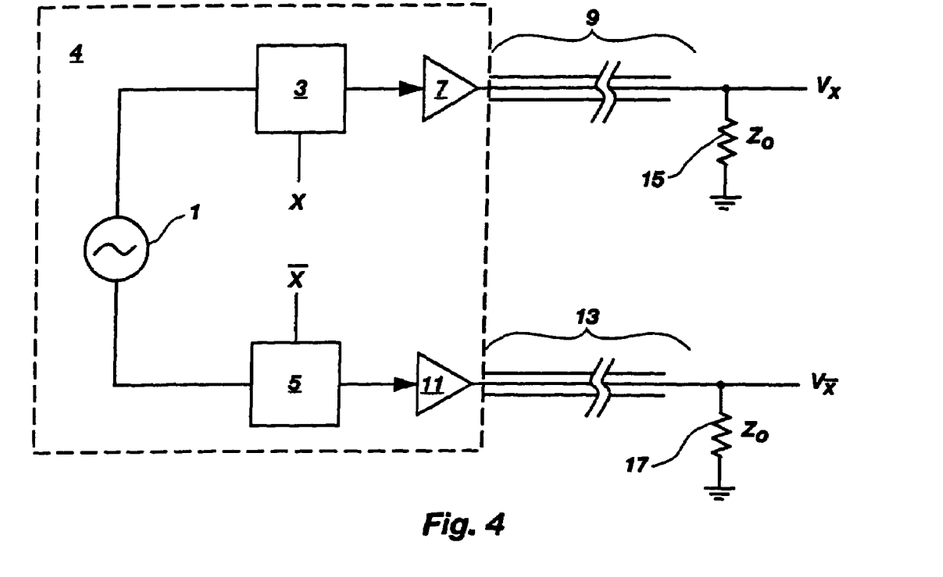
FIG. 4 is a block diagram depicting components of the inventive system used to perform differential Phase Shift Keying of digital data and clock signals.

FIG. 4 is a schematic diagram of differential phase shift keying circuitry 4 that may be used to perform the differential phase shift keying signal interconnection technique of the present invention. A sinusoidal oscillator signal $\sin(\omega t)$ having a radian frequency $\omega$ at the clock signal frequency for the chip is generated by oscillator 1. The oscillator signal is sent simultaneously to phase shifter 3 and phase shifter 5. Digital signal X is input to phase shifter 3 and controls the phase shift produced in the oscillator signal by phase shifter 3, while the complementary digital signal $\bar{X}$ is input to phase shifter 5 and controls the phase shift produced in the oscillator signal by phase shifter 5. The output of phase shifter 3 is fed to driver amplifier 7 and, from there, transmitted on interconnection line 9. The output of phase shifter 5 is fed to driver amplifier 11 and subsequently transmitted on interconnection line 13. Interconnection line 9 and interconnection line 13 are low impedance interconnection lines with matched terminating impedances 15 and 17, respectively.

Figure 5:
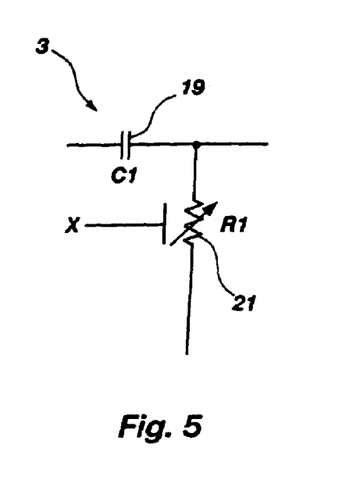
FIG. 5 depicts a lead phase shift network used in the block diagram of FIG. 4.
Figure 7A:
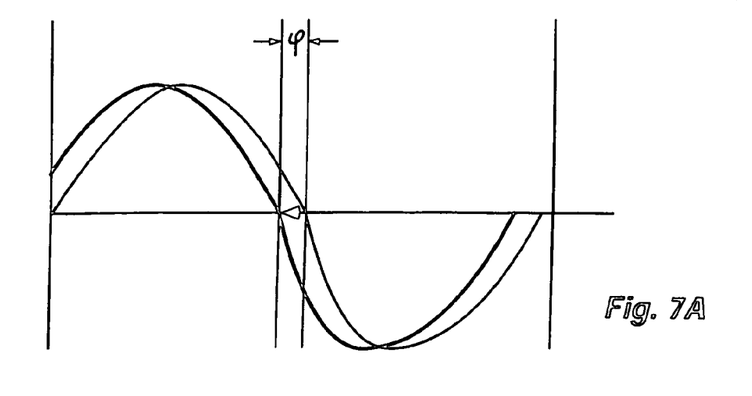
FIG. 7A illustrates the signal $V_x=A\sin(\omega t+\phi)$ output by the lead phase shift network of FIG. 5.

As shown in FIG. 5, phase shifter 3 is a lead phase shift network made up of capacitor 19 and voltage variable resistor 21 forming a high pass filter. Capacitor 19 has a capacitance C1 and voltage variable resistor 21 has a resistance of R1. Voltage variable resistor 21 is an NMOS transistor configured as a voltage variable resistor, with digital signal X connected to its gate to regulate the value of resistance R1. Phase shifter 3 produces a positive phase shift $\phi$ in the input signal when X has a logical high value. Thus, when the input to phase shifter 3 is $\sin(\omega t)$ and X has a logical high value, the output will be $V_x=A\sin(\omega t+\phi)$, and when X has a logical low value, the output will be $V_x=A\sin(\omega t)$, where A is an arbitrary constant. $V_x$ is plotted in FIG. 7A.

Figure 6:
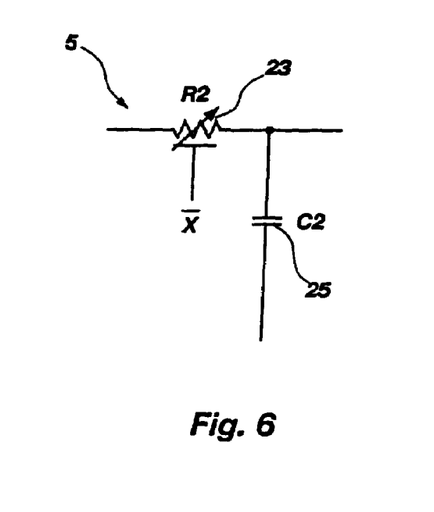
FIG. 6 depicts a lag phase shift network used in the block diagram of FIG. 4.
Figure 7B:
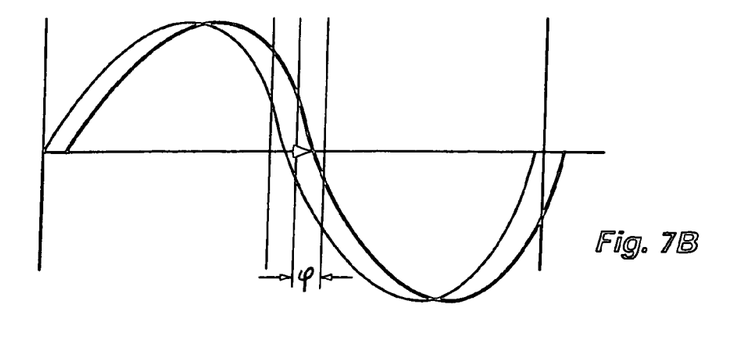
FIG. 7B shows the signal $V_{\bar{x}}=A\sin(\omega t-\phi)$ output by the lag phase shift network of FIG. 6.

FIG. 6 depicts phase shifter 5, which is a lag phase shift network made up of voltage variable resistor 23 and capacitor 25 forming a low pass filter. Capacitor 25 has a capacitance C2 and voltage variable resistor 23 has a resistance of R2. Voltage variable resistor 23 is an NMOS transistor configured as a voltage variable resistor, with complementary digital input $\bar{X}$ connected to its gate to regulate the value of resistance R2. Phase shifter 5 produces a phase shift of equal magnitude but opposite sign to that produced by phase shifter 3; thus, it produces a negative phase shift $\phi$ in the input signal. Thus, when the input to phase shifter 5 is $\sin(\omega t)$ and $\bar{X}$ has a logical high value, the output will be $V_{\bar{x}}=A\sin(\omega t-\phi)$, and when $\bar{X}$ has a logical low value, the output will be $V_{\bar{x}}=A\sin(\omega t)$ where A is the arbitrary constant found in the expression for $V_x$. $V_{\bar{x}}$ is plotted in FIG. 7B.

Both phase shifter 3 and phase shifter 5 utilize phase shift networks of the type used in high frequency ring oscillators as disclosed in U.S. patent application Ser. No. 09/860,131, filed May 17, 2001, now U.S. Pat. No. 6,535,071, issued Mar. 18, 2003, in which the frequency of oscillation can be near $f_T$ of the transistors.

The phase shift keyed signals $V_x$ and $V_{\bar{x}}$ are transmitted on matched interconnection lines 9 and 13 to the vicinity of the clocked element 10. $V_x$ and $V_{\bar{x}}$ each contain both clock and phase shift keyed digital data. Any signal skew which occurs over the length of interconnection lines 9 and 13 should be substantially the same for the signals on the two interconnection lines. At the clocked element 10, PSK signals $V_x$ and $V_{\bar{x}}$ are demodulated to recover the digital signal X and the clock signal.

Figure 8:
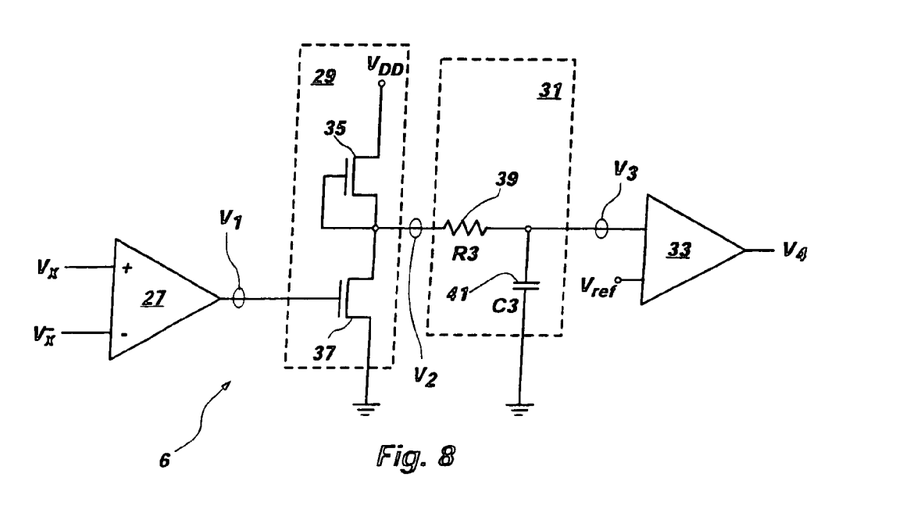
FIG. 8 shows a demodulator circuit for recovering digital data from differential Phase Shift Keyed signals.

Digital signal demodulator 6, which is used to demodulate the digital signal encoded in signals $V_x$ and $V_{\bar{x}}$, is depicted in FIG. 8. Digital signal demodulator 6 includes differential amplifier 27, transistor amplifier circuit 29 which functions as an inverter or single stage amplifier, RC filter 31, and comparator 33. Signals $V_x$ and $V_{\bar{x}}$ are fed into the positive and negative inputs, respectively, of a differential amplifier

27. The difference between $V_x$ and $V_{\bar{x}}$ is $V_x-V_{\bar{x}}=A\sin(\omega t+\phi)-A\sin(\omega t-\phi)=2A\cos(\omega t)\sin(\phi)$ when X has a logical high value. When X has a logical low value, $V_x-V_{\bar{x}}=0$. As noted previously, A is an arbitrary constant amplitude, $\omega$ is the radian frequency of the carrier or oscillator frequency and $\phi$ is the amount of phase modulation at the input. Since $\phi$, the amount of phase modulation, only has two values, zero and some finite value, then the differential output of the receiver is a pulse modulated sine or cosine wave at the carrier frequency.

Transistor amplifier circuit 29 is made up of diode-connected PMOS load transistor 35 and NMOS transistor 37. The demodulator circuit of FIG. 8 takes advantage of the nonlinear characteristics of PMOS load transistor 35 to recover digital data from PSK signals. For simplicity, it can be assumed that PMOS load transistor 35 and NMOS transistor 37 have matching characteristics. Power supply voltage $V_{DD}$ is connected to the source of PMOS load transistor 35. Power supply voltage $V_{DD}=4V_T$, where $V_T$ is the threshold voltage of the PMOS load transistor 35 and NMOS transistor 37. The nominal DC voltage at the output of differential amplifier 27 and the input of transistor amplifier circuit 29 is $2V_T$ when no AC signal is output by differential amplifier 27. The corresponding voltage at the output of transistor amplifier circuit 29 is also $2V_T$. When $V_x$ and $V_{\bar{x}}$ are applied to the inputs of differential amplifier 27, the output is:

$$V_1=2V_T+2A\cos(\omega t)\sin(\phi) \text{ when X has a logical high value}$$
and $V_1=2V_T$ when X has a logical low value.

If the signal amplitude 2 A is made comparable to $V_T$ of the transistors, the output from transistor amplifier circuit 29 is:

$$V_2=2V_T-2A\cos(\omega t)\sin(\phi)-[4A^2/(4V_T)]\cos^2(\omega t)\sin^2(\phi),$$

which, as can be seen, includes a component that depends on the square of the AC component of the input signal.

RC filter 31, which is a simple RC low pass filter at the output of transistor amplifier circuit 29, is made up of resistor 39 having a resistance R3 and capacitor 41 having a capacitance C3. The output of RC filter 31 is:

$$V_3=2V_T-\frac{1}{2}[(4A^2/(4V_T))\sin^2(\phi)],$$

which is the DC component of the output of transistor amplifier circuit 29 and corresponds to the average value of cosine squared. Signal $V_3$ is input to comparator 33 and compared to reference signal $V_{ref}=2V_T$ to produce an output signal $V_4$ which has a value of either $\sin^2(\phi)$ or zero. $V_4$ is the recovered digital data signal.

Figure 9:
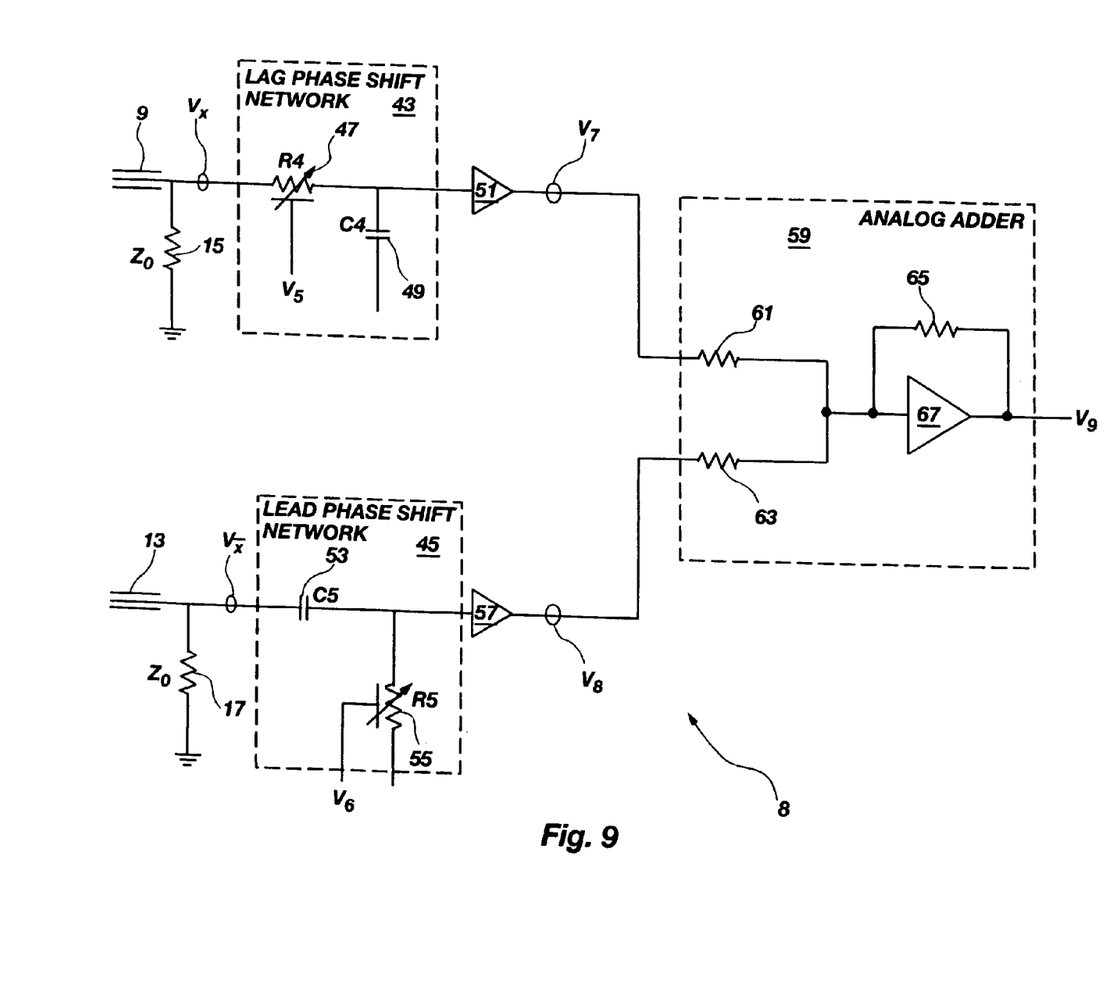
FIG. 9 shows circuitry for recovering a clock signal from differential Phase Shift Keyed signals.

FIG. 9 illustrates the circuitry of clock signal demodulator 8, which is used to recover the clock signal from the modulated RF carrier. Also shown are matched output impedances 15 and 17 of interconnection lines 9 and 13, respectively.

Clock signal demodulator 8 includes two phase shift networks, lag phase shift network 43 and lead phase shift network 45. Lag phase shift network 43 includes a low pass filter made up of voltage variable resistor 47 having resistance R4 and capacitor 49 having resistance C4. The input to lag phase shift network 43 is signal $V_x$ from interconnection line 9. Voltage variable resistor 47 is an NMOS transistor configured as a voltage variable resistor. The resistance R4 of voltage variable resistor 47 is controlled by voltage $V_5$, which is connected to the gate of the NMOS transistor. $V_5=V_{DC}-BV_4$, where $V_{DC}$ is a constant DC voltage, B is an arbitrary constant, and $V_4$ is the recovered digital signal output by the demodulator circuit shown in FIG. 8. The output of lag phase shift network 43 is fed into driver amplifier 51. The output of driver amplifier 51 is $V_7=D\sin(\omega t+\phi-\theta)$, where D is an arbitrary constant, $\omega$ is the radian frequency of the clock signal, $\phi$ is the phase shift introduced by phase shifter 3 (see FIG. 4) during phase shift keying of the digital data, and $\theta$ is the phase shift introduced by lag phase shift network 43.

Lead phase shift network 45 includes a high pass filter made up of capacitor 53 having capacitance C5 and voltage variable resistor 55 having resistance R5. The input to lead phase shift network 45 is signal $V_{\bar{x}}$ from interconnection line 13. Voltage variable resistor 55 is an NMOS transistor configured as a voltage variable resistor. The resistance R5 of voltage variable resistor 55 is controlled by voltage $V_6$, which is connected to the gate of the NMOS transistor. $V_6=V_{DC}+BV_4$, where $V_{DC}$, B, and $V_4$ are as defined previously. The output of lead phase shift network 45 is fed into driver amplifier 57. The output of driver amplifier 57 is $V_8=D\sin(\omega t-\phi+\theta)$, where D is the same arbitrary constant as found in the equation for $V_7$, $\omega$ is the radian frequency of the clock signal, $\phi$ is the phase shift introduced by phase shifter 5 (see FIG. 4) during phase shift keying of the digital data, and $\theta$ is the phase shift introduced by lead phase shift network 45.

In lag phase shift network 43 and lead phase shift network 45, changing the resistance values R4 and R5 changes the phase shift of each network. In lead phase shift network 45, decreasing R5 increases the phase shift $\theta$, making it more positive, since the corner frequency, $\omega_c$, moves up closer to the carrier frequency, $\omega$. In lag phase shift network 43, increasing R4 lowers the corner frequency $\omega_c$ and makes $\theta$ more negative, or shifts the phase of the incoming signal to more negative values.

The gains and characteristics of lag phase shift network 43 and lead phase shift network 45 are adjusted so that $\phi=\theta$. An analog adder 59 made up of resistors 61, 63, and 65 and amplifier 67 is used to average signals $V_7$ and $V_8$ to reduce noise and errors and yield output $V_9$, which equals the clock signal $\sin(\omega t)$ without the modulation of the digital data. In this manner, the clock signal can be recovered.

The frequency limiting element in this system is not the oscillator, carrier frequency, digital modulation frequency, or line characteristics but, rather, is likely to be the receiver amplifier. By using a relatively small number of CMOS elements in the circuitry of the invention, power consumption is kept low. The novel PSK method allows clock and data signals to be transmitted over any distance and to remain synchronized with each other. Speed and performance of the device are thus enhanced.

What is claimed is:

1. A clock signal demodulator, comprising:
    a lag phase shift network configured for receiving a lead output signal and removing a positive phase shift of the lead output signal to recover a first clock signal;
    a lead phase shift network configured for receiving a lag output signal and adding a negative phase shift of the lag output signal to recover a second clock signal; and
    an analog adder configured for averaging the first clock signal and the second clock signal to produce a demodulated clock signal.

2. The clock signal demodulator of claim 1, wherein the lag phase shift network comprises a low pass filter including a voltage variable resistor and a capacitor.

3. The clock signal demodulator of claim 1, wherein the lag phase shift network further comprises:
    an NMOS transistor configured as a voltage variable resistor operably coupled between the lead output signal and a low-pass filtered signal, and including a gate operably coupled to a first voltage source for controlling a resistance of the NMOS transistor;

a capacitor operably coupled to the low-pass filtered signal; and a driver amplifier operably coupled to the low-pass filtered signal and configured for driving the first clock signal.

4. The clock signal demodulator of claim 3, wherein the first voltage source comprises a voltage V represented by the equation:

$$V=V_{DC}-BV_D$$

where $V_{DC}$ is a constant DC voltage, B is an arbitrary constant, and $V_D$ is a digital signal from a digital signal demodulator.

5. The clock signal demodulator of claim 1, wherein the lead phase shift network comprises a high pass filter including a capacitor and a voltage variable resistor.

6. The clock signal demodulator of claim 1, wherein the lead phase shift network further comprises:
a capacitor operably coupled between the lag output signal and a high-pass filtered signal;
an NMOS transistor configured as a voltage variable resistor operably coupled to the high-pass filtered signal and including a gate operably coupled to a second voltage source for controlling a resistance of the NMOS transistor; and
a driver amplifier operably coupled to the high-pass filtered signal and configured for driving the second clock signal.

7. The clock signal demodulator of claim 6, wherein the second voltage source comprises a voltage V represented by the equation:

$$V=V_{DC}+BV_D$$

where $V_{DC}$ is a constant DC voltage, B is an arbitrary constant, and $V_D$ is a digital signal from a digital signal demodulator.

8. The clock signal demodulator of claim 1, wherein the analog adder comprises:
a set of resistors for summing the first clock signal and the second clock signal; and
an amplifier in combination with a feedback resistor configured for receiving a summed result of the first clock signal and the second clock signal and producing the demodulated clock signal.

9. A phase shift keying apparatus, comprising:
a lead phase shift network configured for receiving a sinusoidal oscillator signal, receiving a digital signal, and producing a positive phase shift in a lead output signal when the digital signal has a logical high value; and
a lag phase shift network configured receiving the sinusoidal oscillator signal, receiving a complementary digital signal, and producing a negative phase shift in a lag output signal when the complementary digital signal has a logical high value.

10. The device of claim 9, wherein the lead phase shift network comprises a capacitor and a voltage variable resistor in combination to form a high pass filter.

11. The device of claim 9, wherein the lead phase shift network comprises:
a capacitor operably coupled between the sinusoidal oscillator signal and a first phase shift signal;
an NMOS transistor configured as a voltage variable resistor operably coupled to the first phase shift signal and including a gate operably coupled to the digital signal for controlling a resistance of the NMOS transistor; and
a driver amplifier operably coupled to the first phase shift signal and configured for driving the lead output signal.

12. The device of claim 9, wherein the lag phase shift network comprises a voltage variable resistor and a capacitor in combination to form a low pass filter.

13. The device of claim 9, wherein the lag phase shift network comprises:
an NMOS transistor configured as a voltage variable resistor operably coupled between the sinusoidal oscillator signal and a second phase shift signal, and including a gate operably coupled to the complementary digital signal for controlling a resistance of the NMOS transistor;
a capacitor operably coupled to the second phase shift signal; and
a driver amplifier operably coupled to the second phase shift signal and configured for driving the lag output signal.

14. The device of claim 9, wherein the lead output signal from the lead phase shift network comprises a voltage represented by the function $V_x = A\sin(\omega t + \phi)$ when the digital signal has a logical high value and a voltage represented by the function $V_x = A\sin(\omega t)$ when the digital signal has a logical low value, wherein A is an arbitrary constant, $\omega$ is the oscillator frequency, and $\phi$ is the amount of phase shift.

15. The device of claim 9, wherein the lag output signal from the lag phase shift network comprises a voltage represented by the function $V_{\bar{x}} = A\sin(\omega t - \phi)$ when the complementary digital signal has a logical high value and a voltage represented by the function $V = A\sin(\omega t)$ when the complementary digital signal has a logical low value, wherein A is an arbitrary constant, $\omega$ is the oscillator frequency, and $\phi$ is the amount of phase shift.

16. The device of claim 9, wherein the phase shift in the lead output signal and the lag output signal are of equal magnitude but having opposite signs.

* * * * *

UNITED STATES PATENT AND TRADEMARK OFFICE
CERTIFICATE OF CORRECTION

| | | |
|---|---|---|
| PATENT NO. | : 7,369,623 B2 | Page 1 of 1 |
| APPLICATION NO. | : 11/594480 | |
| DATED | : May 6, 2008 | |
| INVENTOR(S) | : Forbes | |

It is certified that error appears in the above-identified patent and that said Letters Patent is hereby corrected as shown below:

In column 7, line 51, in Claim 9, after "configured" insert -- for --.

In column 8, line 37, in Claim 14, delete "($\omega$t )" and insert -- ($\omega$t) --, therefor.

In column 8, line 43, in Claim 15, delete "$\overline{V_x}$" and insert -- $V_x$ --, therefor.

In column 8, line 45, in Claim 15, delete "($\omega$t )" and insert -- ($\omega$t) --, therefor.

Signed and Sealed this

Nineteenth Day of August, 2008

JON W. DUDAS
*Director of the United States Patent and Trademark Office*